(12) United States Patent
Chen

(10) Patent No.: US 8,143,712 B2
(45) Date of Patent: Mar. 27, 2012

(54) DIE PACKAGE STRUCTURE

(75) Inventor: Jen-Chung Chen, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 99 days.

(21) Appl. No.: 12/836,583

(22) Filed: Jul. 15, 2010

(65) Prior Publication Data
US 2012/0013018 A1 Jan. 19, 2012

(51) Int. Cl.
*H01L 23/02* (2006.01)
(52) U.S. Cl. .. 257/686; 257/724; 257/777; 257/E23.174
(58) Field of Classification Search .................. 257/686, 257/724, 774, 777, E21.499, E23.011, E23.174; 438/107
See application file for complete search history.

(56) References Cited

U.S. PATENT DOCUMENTS

| | | | | |
|---|---|---|---|---|
| 7,598,607 B2* | 10/2009 | Chung et al. | ................... | 257/686 |
| 7,902,674 B2* | 3/2011 | Chang et al. | ................... | 257/777 |
| 8,102,058 B2* | 1/2012 | Hsieh et al. | ................... | 257/774 |
| 2009/0134527 A1* | 5/2009 | Chang | ........................... | 257/777 |

* cited by examiner

*Primary Examiner* — Tuan N. Quach
(74) *Attorney, Agent, or Firm* — Winston Hsu; Scott Margo

(57) ABSTRACT

A die package structure, which comprises: a first die; a second die; a core material layer, provided between the first die and the second die; at least one via, penetrating through the first die, the second die and the core material layer; a metal material, stuffing into the via, such that the first die the second die, and the core material layer can be electrically contacted with each other; at least a signal contacting unit, contacting the metal material; and a dielectric layer, enclosing the first die, including at least one breach exposing the signal contacting unit.

6 Claims, 7 Drawing Sheets

(a)

(b)

(a)

(b)

(a)

(b)

(a)

(b)

(a)

(b)

(a)

(b)

(a)

(b)

(a)

(b)

DIE PACKAGE STRUCTURE

BACKGROUND OF THE INVENTION

1. Field of the Invention

The present invention relates to a die package structure and a related die package structure manufacturing method, and particularly relates to a die package structure utilizing a TSV structure and a related die package structure manufacturing method.

2. Description of the Prior Art

High speed and high density structure are desired for current DRAM technique. In order to meet the requirement of a high density structure, a 3D package technique is developed. Comparing with the traditional 2D package technique, the chip utilizing the 3D package technique has a vertically-conductive structure. Such that the chip can have a shorter conductive path and less signal delay time than a chip utilizing the traditional 2D package technique. Besides, chip performance can increase via such structure. Also, chip power consumption, parasitic capacitance and conductance can decrease as well.

TSV (Through-Silicon Via) technique is one kind of 3D package technique. However, current TSV technique is still unstable and has high cost such that current TSV technique is hard to compete with traditional package technique.

SUMMARY OF THE INVENTION

Therefore, one object of the present invention is to provide a simple 3D package structure.

One embodiment of the present invention discloses a die package structure, which comprises: a first die; a second die; a core material layer, provided between the first die and the second die; at least one via, penetrating through the first die, the second die and the core material layer; a metal material, stuffing into the via, such that the first die, the second die, and the core material layer can be electrically contacted with each other; at least a signal contacting unit, contacting the metal material; and a dielectric layer, enclosing the first die, including at least one breach exposing the signal contacting unit.

Another embodiment of the present invention discloses a die package structure manufacturing method, which comprises: (a) forming a core material layer with vias having metal provided therein, wherein the metal has a protruding part protruding out the core material layer; (b) providing a first die on a first side of the core material layer, wherein the first die has vias electrically connected to the vias of core material layer on a first side of the first die; (c) providing at least one signal contacting unit on the first die, wherein the signal contacting unit is provided on a second side of the first die, wherein the second side of the first die is opposite to the first side of the first die; (d) forming a dielectric layer on the first die and the core material layer, wherein the dielectric layer has breaches exposing the signal contacting unit; and (e) providing a second die on a second side of the core material layer, wherein the second side of the core material layer is opposite to the first side of the core material layer.

According to abovementioned embodiments, pad circuits can be quickly formed such that a simple but complete 3D package structure is provided.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
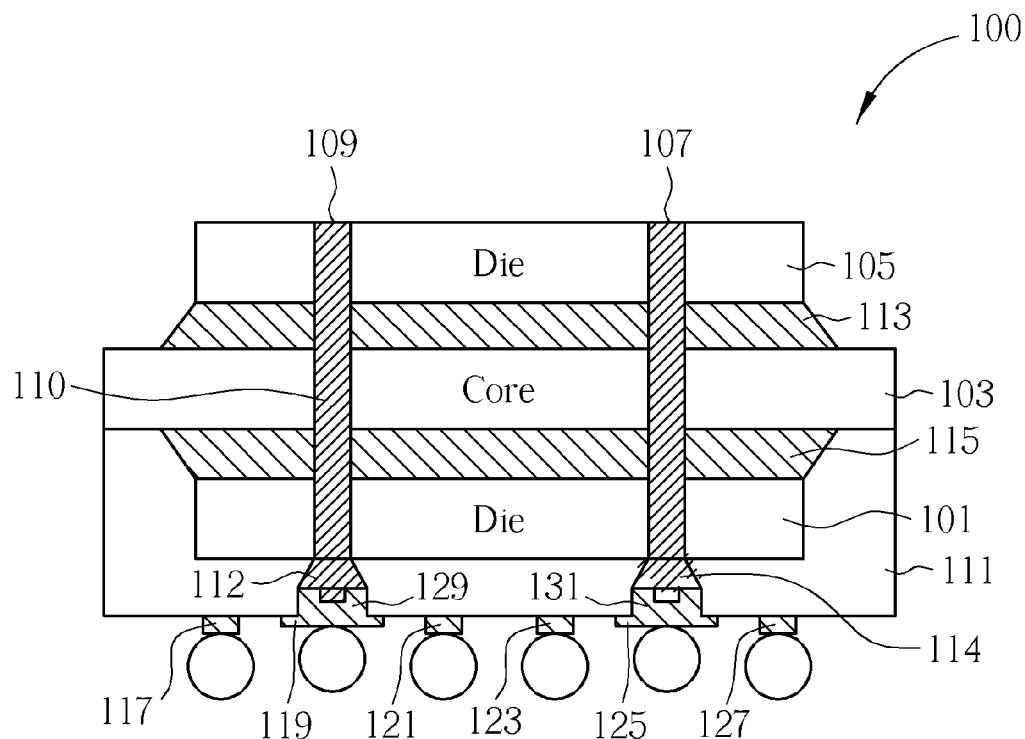
FIG. 1 and FIG. 2 are sectional drawings illustrating a die package structure according to one embodiment of the present invention.

FIG. 1 is a sectional drawing illustrating a die package structure 100 according to one embodiment of the present invention. As shown in FIG. 1, the die package structure 100 includes a first die 101, a core material layer 103, a second die 105, vias 107, 109, metal material 110, a dielectric layer 111, strobe bumps 112, 114, underfill material 113, 115, and pads 117~127. The core material layer 103, which can be polymer material such as PI, is provided between the first die 101 and the second die 105. Also, the underfill material 113 is provided between the second die 105 and the core material layer 103, and the underfill material 115 is provided between the first die 101 and the core material layer 103. The vias 107, 109 penetrate through the first die 101, the second die 105 and the core material layer 103. The metal material 110 is stuffed into the vias 107 and 109, such that the first die 101, the second die 105, and the core material layer 103 can be electrically contacted with each other. The strobe bumps 112, 114 contact the metal material 110, such that solder balls bounding on the pads 117~127 can contact the metal 110 via the strobe bumps 112, 114. That is, the strobe bumps 112, 114 are utilized as signal contacting unit. The dielectric layer 111 encloses the first die 101 and includes the breaches 129, 131 to expose the strobe bumps 112, 114.

Figure 2:
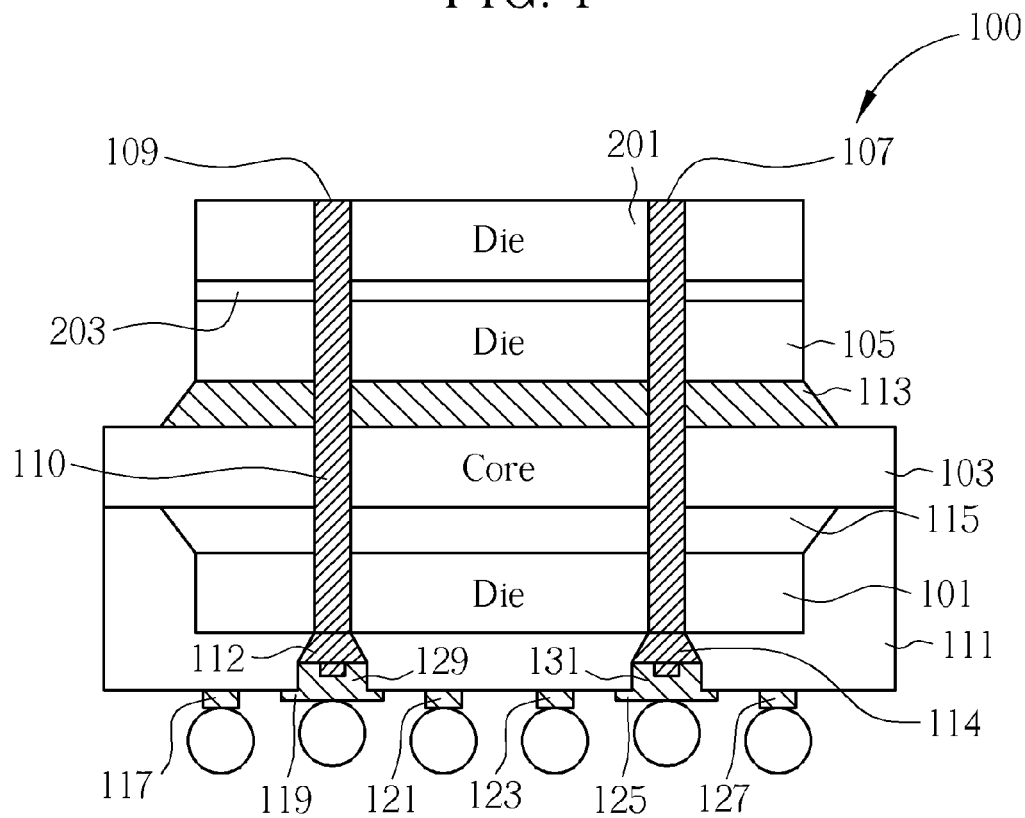
Figure 3:
FIGS. 3-10 illustrate a manufacturing method to manufacture a die package structure according to one embodiment of the present invention.
Figure 3:
Figure 4:
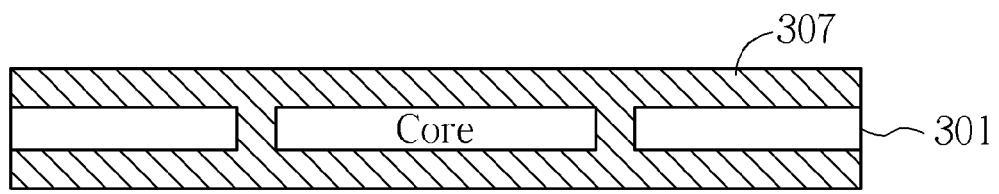
Figure 4:
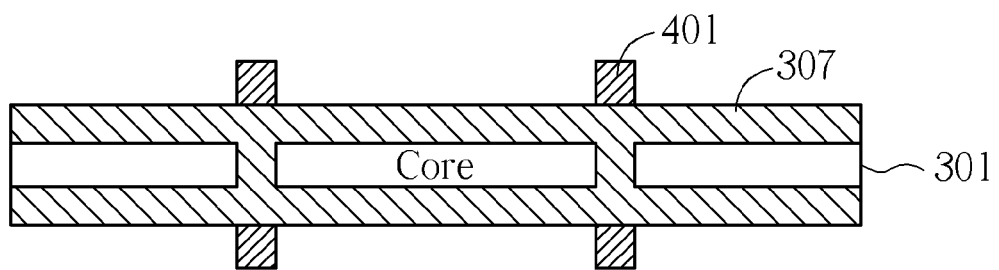
Figure 5:
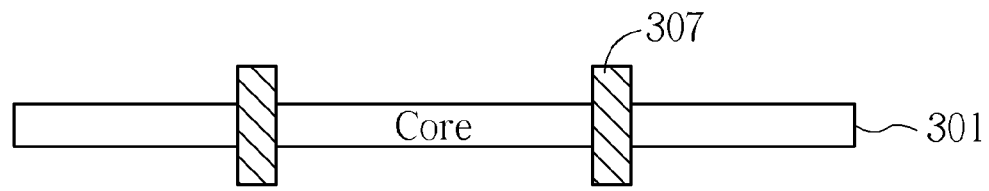
Figure 5:
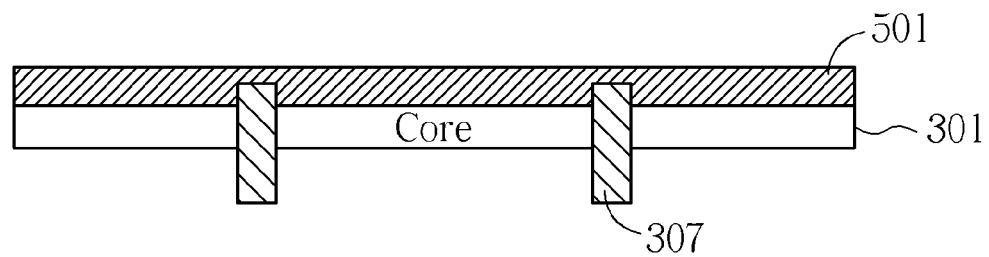
Figure 6:
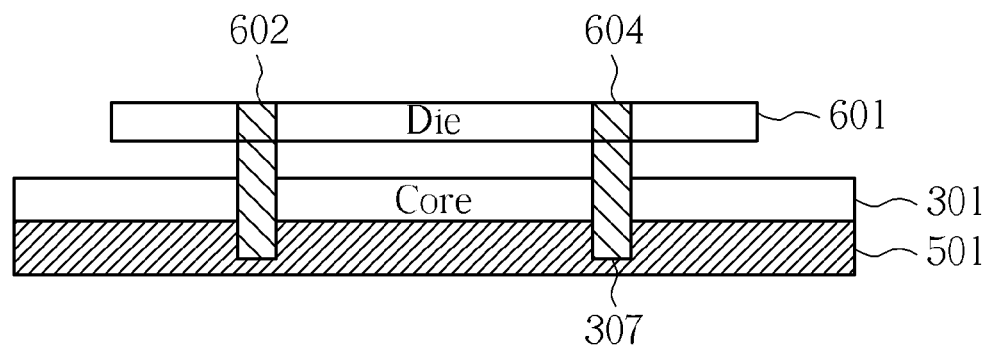
Figure 6:
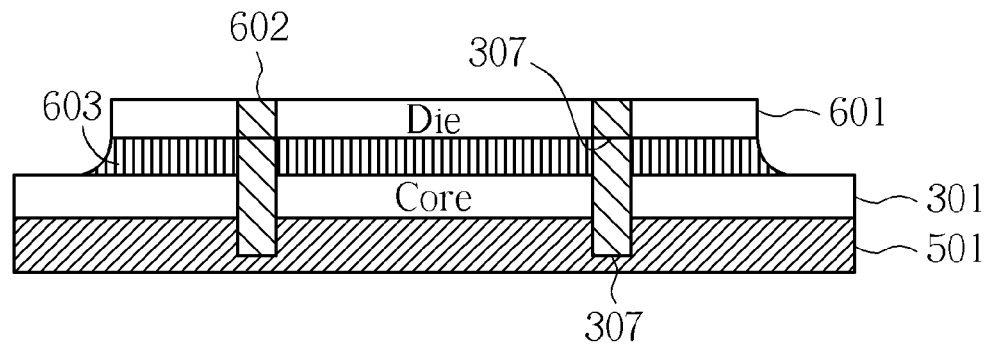
Figure 7:
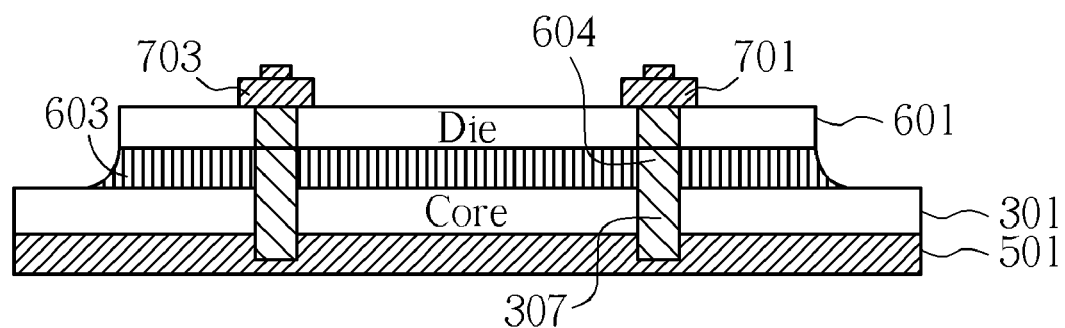
Figure 7:
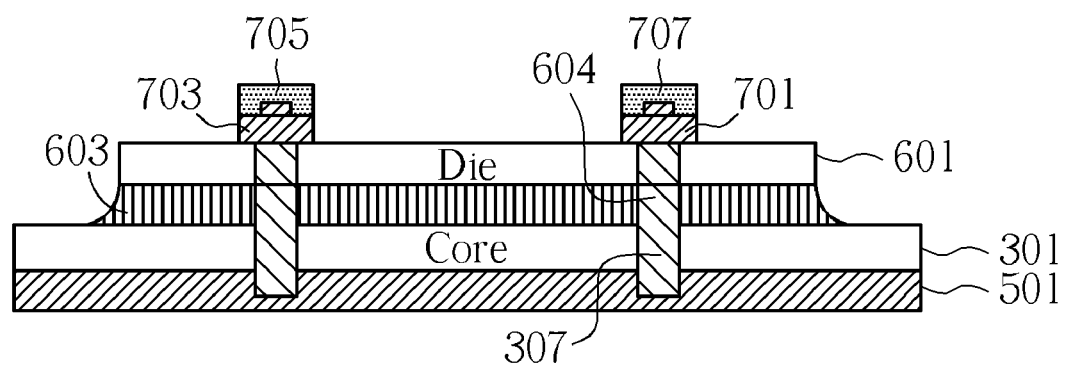
Figure 8:
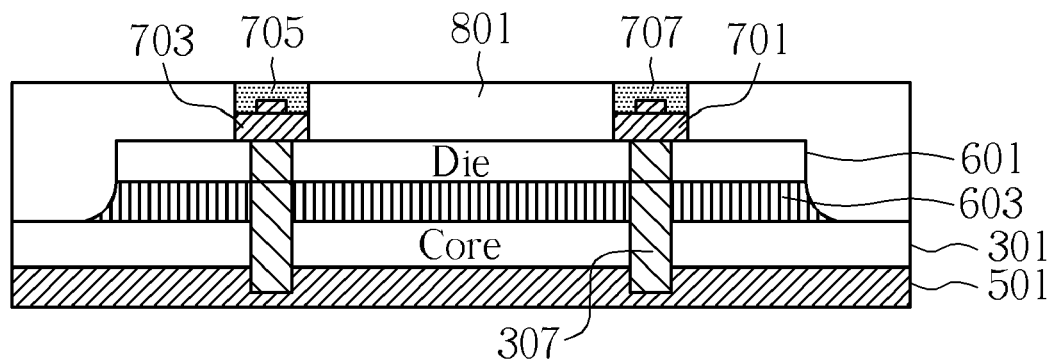
Figure 8:
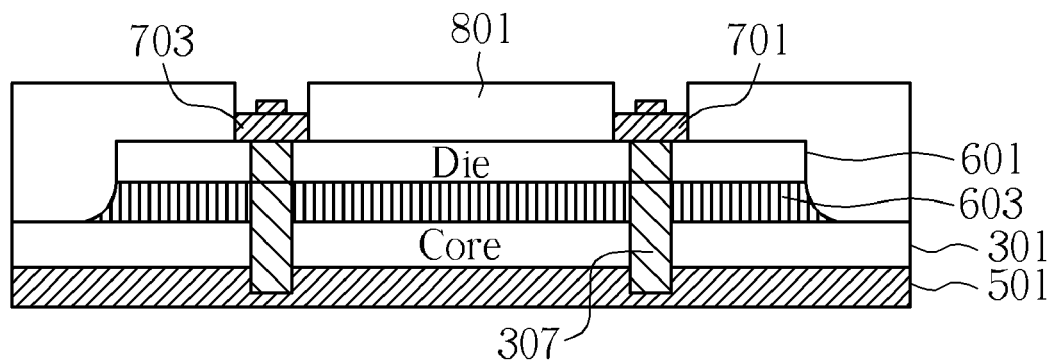
Figure 9:
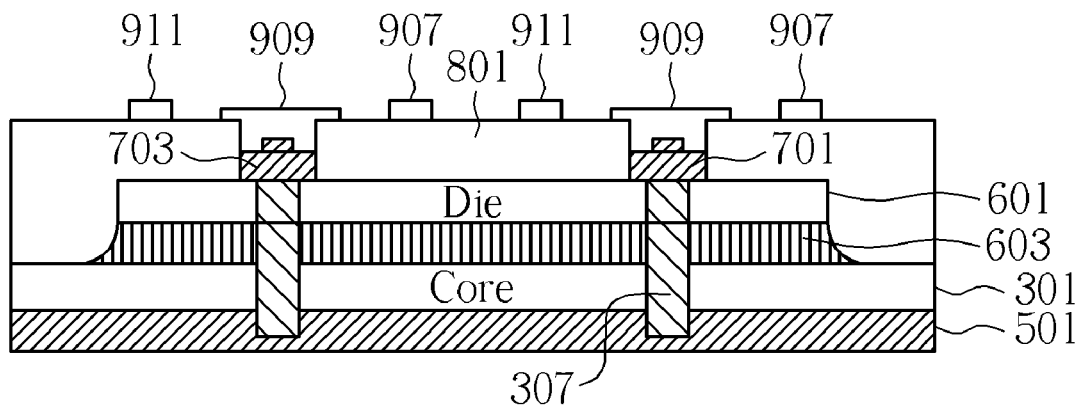
Figure 9:
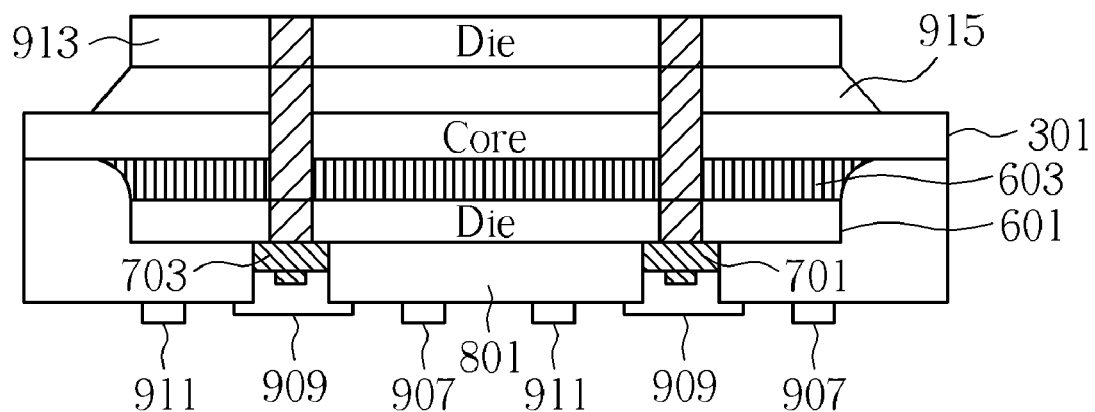
Figure 10:
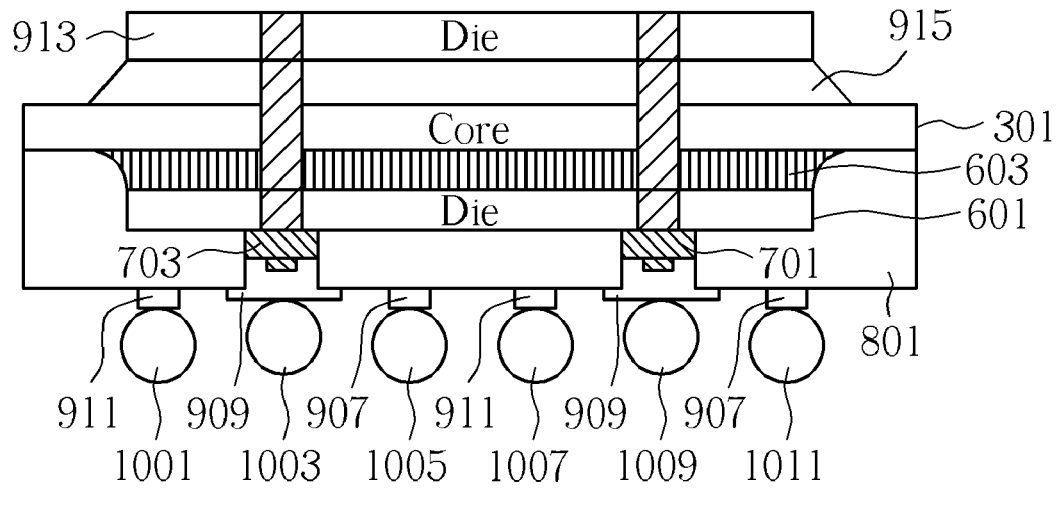
Figure 10:
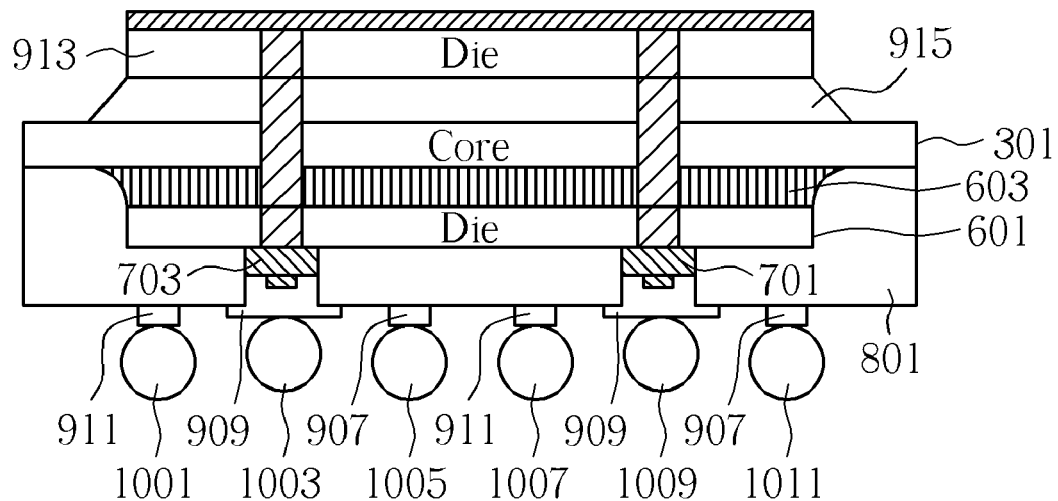

In one embodiment, the first die 101 is for a master device such as a controller, and the second die 105 is for a slave device. Furthermore, the die package structure 100 can further include other dies besides the first die 101 and the second die 105. As shown in FIG. 2, the die package structure 100 further includes a third die 201, which is also for a slave device. Please note that more dies can be included in the die package structure, but it is not shown for brevity here. In this case, underfill material 203 is also provided between the second die 105 and the third die 201. Such structure can be utilized for many kinds of electronic devices such as a DRAM.

FIGS. 3~10 illustrate a manufacturing method to manufacture a die package structure according to one embodiment of the present invention. Please note that the steps of FIGS. 3~10 are only for example and do not mean to limit the scope of the present invention.

As shown in FIG. 3(a), a core material layer 301, which can be polymer material such as PI, is provided. In FIG. 3(b), vias 303 and 305 are formed in the core material layer 301. After that, in FIG. 4(a), the metal material 307 such as copper can be provided on the core material layer 301 (e.x. via a coating process. In FIG. 4(b), PR (Photo Resist) layer 401 is provided on some part of the metal material 307. Then other parts of the metal material 307 is removed by litho or etching, thus the core material layer 301 having metal material 307 protruding the surface thereof, as in FIG. 5(a) is formed. Thereafter, a PR layer 501 is provided on the core material layer 301.

In FIG. 6(a), a first die 601 is provided on the core material layer 301. Please note the first die 601 is provided on a surface opposite to the surface on which the PR layer is provided. The first die 601 includes vias 602 and 604 (i.e. a TSV structure). The vias of the core material layer 301 and the first die 601 can be connected via some processes such as thermal compressing, ultra-sonic compressing, or flux. Also, underfill material 603 can be provided between the core material layer 301 and the first die 601, such that the first die 601 can be tightly connected to the core material layer 301 and steam can be prevented entering the gap between the core material layer 301 and the first die 601.

In FIG. 7(a), strobe bumps 701, 703, which can be utilized as a signal contacting unit, are provided to contact the vias 602, 604 of the first die 601. Via these kinds of strobe bumps 701, 703, the process for growing metal seed and thin film can be omitted, such that the pad circuit on the dielectric material 801 can be quickly formed. In FIG. 7(b), a litho process can be utilized to align the locations of strobe bumps 701, 703, such that PR material 705, 707 will be provided on the strobe bumps 701, 703. After that, dielectric material 801, which can be UV paste or B-stage epoxy, can be provided via a printing process (not limited). In FIG. 8(b), the PR material 705, 707 are removed, such that breaches exposing the strobe bumps 701, 703 are formed.

In FIG. 9(a), pads 901~911 for solder balls are provided on FIG. 9(a). In FIG. 9(b), a second die 913 is provided. Additionally, similar with the first chip 601, underfill material 915 is provided between the second die 913 and the core material layer 301. In FIG. 10(a), solder balls 1001~1011 are provided on the pads 901~911, and an ink process can be performed to form the structure of FIG. 10(b). Then a UBM process can be performed to an active surface for an active surface of the second die 913. As mentioned above, more dies can be provided to form a structure shown in FIG. 2, and a DRAM with higher storage capacity can be manufactured by this way.

According to abovementioned embodiments, pad circuits can be quickly formed such that a simple but complete 3D package structure is provided.

Those skilled in the art will readily observe that numerous modifications and alterations of the device and method may be made while retaining the teachings of the invention.

What is claimed is:

1. A die package structure, comprising:
   a first die;
   a second die;
   a core material layer, provided between the first die and the second die;
   at least one via, penetrating through the first die, the second die and the core material layer;
   a metal material, stuffing into the via, such that the first die the second die, and the core material layer can be electrically contacted with each other; and
   at least a signal contacting unit, contacting the metal material;
   a dielectric layer, enclosing the first die, including at least one breach exposing the signal contacting unit.

2. The die package structure of claim 1, wherein the first die is for a master device, and the second die is for a slave device.

3. The die package structure of claim 1, further comprising a third die including at least one via such that the third die can be electrically contacted with the second die.

4. The die package structure of claim 1, further comprising underfill material provided between the first die and the core material, and between the second die and the core material.

5. The die package structure of claim 1, further comprising pads provided near the breaches.

6. The die package structure of claim 1, wherein the core material layer comprises polymer material.

* * * * *